US010928460B2

(12) United States Patent
Goto et al.

(10) Patent No.: US 10,928,460 B2
(45) Date of Patent: Feb. 23, 2021

(54) METHOD OF INSPECTING POWER STORAGE DEVICE BASED ON DISCHARGE CURRENT AND METHOD OF PRODUCING THE SAME

(71) Applicant: TOYOTA JIDOSHA KABUSHIKI KAISHA, Toyota (JP)

(72) Inventors: Takeshi Goto, Kasugai (JP); Kiwamu Kobayashi, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 38 days.

(21) Appl. No.: 16/423,373

(22) Filed: May 28, 2019

(65) Prior Publication Data

US 2020/0025831 A1 Jan. 23, 2020

(30) Foreign Application Priority Data

Jul. 19, 2018 (JP) .............................. JP2018-136100

(51) Int. Cl.
*G01R 31/389* (2019.01)
*H01M 10/42* (2006.01)
*G01R 31/36* (2020.01)

(52) U.S. Cl.
CPC ....... *G01R 31/389* (2019.01); *G01R 31/3644* (2013.01); *H01M 10/4285* (2013.01)

(58) Field of Classification Search
CPC .............. G01R 31/3644; G01R 31/389; G01R 31/386; G01R 31/3865; G01R 31/392; G01R 31/00; G01R 31/002; G01R 31/36; G01R 31/382; G01R 31/385; H01M 10/4285; H01M 10/48; H01M 10/00;

(Continued)

(56) References Cited

U.S. PATENT DOCUMENTS

| 10,036,779 B2 * | 7/2018 | Sazhin | G01R 31/50 |
| 2018/0164363 A1 * | 6/2018 | Brorein | G01R 31/52 |
| 2019/0056457 A1 * | 2/2019 | Li | H02J 7/0021 |

FOREIGN PATENT DOCUMENTS

JP 2010153275 A 7/2010

OTHER PUBLICATIONS

Kobayashi et al., "Inspection Apparatus of Electrical Storage Device," U.S. Appl. No. 16/238,100, filed Jan. 2, 2019.

(Continued)

*Primary Examiner* — Jay Patidar
(74) *Attorney, Agent, or Firm* — Dickinson Wright PLLC

(57) ABSTRACT

A circuit is formed by connecting positive terminals and negative terminals of a power storage device and an external power supply, and a resistor and a switch are arranged in series between a positive-side conductor and a negative-side conductor. An ON time for which the switch is temporarily closed before start of inspection is made longer as the capacity of the power storage device is larger. An ON voltage between the positive-side and negative-side conductors within the ON time, and an OFF voltage between these conductors at a time other than the ON time are obtained, and a parasitic resistance value of the circuit is calculated based on the ON and OFF voltages and a resistance value of the resistor. During the inspection, the voltage of the external power supply, which is applied to the power storage device, is increased according to the parasitic resistance value.

3 Claims, 9 Drawing Sheets

(58) Field of Classification Search
CPC ............... H01M 10/05; H01M 10/052; H01M 10/0525; H01M 10/0587; H01M 10/42; H01M 10/44; H01M 10/448; H01M 10/482
USPC ........................................ 324/425, 426, 430
See application file for complete search history.

(56) References Cited

OTHER PUBLICATIONS

Kobayashi et al., "Inspection Method and Manufacturing Method of Electrical Storage Device," U.S. Appl. No. 16/182,683, filed Nov. 7, 2018.

* cited by examiner

METHOD OF INSPECTING POWER STORAGE DEVICE BASED ON DISCHARGE CURRENT AND METHOD OF PRODUCING THE SAME

INCORPORATION BY REFERENCE

The disclosure of Japanese Patent Application No. 2018-136100 filed on Jul. 19, 2018 including the specification, drawings and abstract is incorporated herein by reference in its entirety.

BACKGROUND

1. Technical Field

The disclosure relates to an inspecting method for determining the quality of a power storage device. More particularly, the disclosure relates to a method of inspecting a power storage device, with which the quality can be determined with appropriate accuracy according to various conditions, based on an amount of discharge current, rather than an amount of voltage reduction of the power storage device. The disclosure also relates to a method of producing the power storage device, which method includes the inspecting method.

2. Description of Related Art

Various inspection technologies for determining the quality of a secondary battery, or other power storage devices, have been proposed. For example, in a method described in Japanese Unexamined Patent Application Publication No. 2010-153275 (JP 2010-153275 A), a secondary battery to be inspected is left to stand in a pressurized state in a leaving step, and the battery voltage is measured before and after the leaving step. A difference in the battery voltage before and after the leaving step is an amount of voltage reduction caused by leaving to stand. The battery having a large voltage reduction amount means a battery of which the self-discharge amount is large. Thus, the quality of the secondary battery can be determined based on whether the voltage reduction amount is large or small.

SUMMARY

However, it takes time to determine the quality of the secondary battery in the known method as described above. This is because a significant amount of reduction of the voltage cannot be produced unless the secondary battery is left to stand for a long period of time in the leaving step. One reason for this is contact resistance that appears at the time of measurement of the voltage. To measure the voltage, a measuring instrument is connected between the opposite terminals of the secondary battery. At this time, contact resistance inevitably exists between the terminals of the secondary battery and the terminals of the measuring instrument, and measurement results are influenced by the contact resistance. The contact resistance varies each time the terminals of the secondary battery are connected with the terminals of the measuring instrument. Thus, unless the voltage reduction amount itself is large to some extent, variations in the contact resistance among different measurements cannot be ignored.

Further, the accuracy of voltage measurement is not so good, because the voltage measurement is inevitably subjected to an influence of voltage drop in a current-carrying path at the time of measurement. Then, contact positions between the terminals of the secondary battery and the terminals of the measuring instrument differ slightly each time the secondary battery is connected with the measuring instrument; therefore, the degree of voltage drop also varies among different measurements. Thus, it may be considered to use current measurement in place of the voltage measurement, so as to reduce the time required for measurement of the self-discharge amount, and improve the measurement accuracy. Since current is constant throughout the circuit, the current measurement is hardly influenced by the contact positions, unlike the voltage measurement. Nonetheless, simply replacing voltage measurement with current measurement does not necessarily lead to quick, favorable determination, because measurement results depend on variations in various conditions, such as the charge voltage of the secondary battery, and measurement environments.

Here, when an inspection is carried out via current measurement, it is useful to be aware in advance of parasitic resistance in the circuit during inspection, in order to shorten the inspection time. To this end, it may be considered to provide a step of measuring the parasitic resistance in advance. However, the accuracy in measurement of the parasitic resistance value also becomes a problem. The accuracy in measurement of the parasitic resistance value has a trade-off relationship with the measurement accuracy at the time of subsequent current measurement, and is also influenced by other inspection conditions. Thus, depending on other inspection conditions, the accuracy in measurement of the parasitic resistance value may become poor, or, conversely, the accuracy in measurement of discharge current as a main object of the inspection may be reduced.

This disclosure provide a method of inspecting a power storage device, by measuring a parasitic resistance value for use in determination of the quality of the power storage device via current measurement, within an appropriate measurement time according to other inspection conditions, thus assuring the accuracy in the inspection as a whole. This disclosure also provides a method of producing a power storage device, which method includes the above inspecting method.

A method of inspecting a power storage device according to a first aspect of the disclosure includes connecting a positive terminal of the power storage device with a positive terminal of an external power supply via a positive-side conductor, and connecting a negative terminal of the power storage device with a negative terminal of the external power supply via a negative-side conductor, to form a circuit, and placing a resistance path between the positive-side conductor and the negative-side conductor, the resistance path including a resistor and a switch connected in series (circuit forming step). The method includes setting a length of an ON time for which the switch is temporarily closed before start of inspection of the power storage device, according to a storage capacity of the power storage device, such that the ON time is longer as the storage capacity is larger, and the ON time is shorter as the storage capacity is smaller (ON-time setting step). The method includes temporarily closing the switch over the ON time to be set, after the resistance path is placed, obtaining an ON voltage as a voltage between the positive-side conductor and the negative-side conductor within the ON time, and an OFF voltage as a voltage between the positive-side conductor and the negative-side conductor at a time other than the ON time, and calculating a parasitic resistance value of the circuit, based on a voltage value of the ON voltage, a voltage value of the OFF voltage, and a resistance value of the resistor (resistance measuring step). The method includes applying a voltage of the external power supply to the power storage device in a condition where the switch is open, after the parasitic resistance value of the circuit is calculated, and inspecting the power storage device using a current value of the circuit, while increasing the voltage of the external power supply, according to the parasitic resistance value, within a range in which an absolute value of an imaginary resistance value is kept smaller than the parasitic resistance value of the circuit (inspecting step). The imaginary resistance is a negative value obtained by converting an amount of increase of the current value of the circuit when the voltage of the external power supply is increased, into an amount of reduction of the parasitic resistance value of the circuit. The power storage device is inspected using the current value of the circuit, by determining whether a self-discharge current of the power storage device is larger or smaller than a predetermined value, based on a condition of convergence of a circuit current flowing in the circuit.

In the method of inspecting the power storage device according to the above aspect, initially in the circuit forming step, the positive terminals of the power storage device and the external power supply are connected to each other via the conductor, and the negative terminals of the power storage device and the external power supply are connected to each other via the conductor, so as to form the circuit for use in the inspection. Also, the resistance path, in which the resistor and the switch are connected in series, is placed between the positive-side and negative-side conductors. In the ON-time setting step, the length of the ON time is set. The ON time is a length of time for which the switch is temporarily closed in the subsequent resistance measuring step. More specifically, the ON time is set to be longer as the storage capacity of the power storage device is larger, and is set to be shorter as the storage capacity is smaller. The ON time setting step is only required to be performed before the next resistance measuring step, and may be finished prior to the circuit forming step.

Then, in the resistance measuring step, the switch is temporarily closed over the set ON time. Also, the voltage between the positive-side conductor and the negative-side conductor is obtained within the ON time, and at a time other than the ON time. The former voltage is the ON voltage, and the latter voltage is the OFF voltage. Then, the parasitic resistance value of the circuit is calculated, based on these voltage values and the resistance value of the resistor. The parasitic resistance value thus calculated includes contact resistance in the circuit. Since the ON time is set to a relatively long time when the storage capacity of the power storage device is large, the ON voltage is measured with high accuracy, and the parasitic resistance value is calculated with high accuracy. Meanwhile, since the storage capacity is large, voltage variation of the power storage device after the end of the ON time is not so large. The ON time is set to a relatively short time when the storage capacity of the power storage device is small; therefore, it is more beneficial to curb voltage variation of the power storage device after the end of the ON time.

Then, in the inspecting step, a current value of the circuit is measured while a voltage of the external power supply is applied to the power storage device while the switch is open. At this time, the voltage of the external power supply is increased according to the parasitic resistance value. The amount of increase of the voltage of the external power supply is kept within a range in which the absolute value of the imaginary resistance value, as a negative value obtained by converting the amount of increase of current of the circuit due to the voltage increase into the amount of reduction of the parasitic resistance of the circuit, is kept smaller than the parasitic resistance value of the circuit. Thus, the quality of the power storage device can be inspected within a short time, with high accuracy.

In the method of inspecting the power storage device according to the first aspect, when the ON time is set to be longer as the storage capacity of the power storage device is larger, and is set to be shorter as the storage capacity is smaller, the ON time may be set to be shorter as a voltage resolution of a voltage sensor used when calculating the parasitic resistance value of the circuit is higher, and may be set to be longer as the voltage resolution is lower. When the voltage resolution of the voltage sensor is high, an ON voltage value having a sufficiently high accuracy is obtained even if the ON time is short. On the other hand, when the voltage resolution of the voltage sensor is low, an ON voltage value having a high accuracy cannot be obtained unless the ON time is set to a relatively long time.

When the resistance value of the resistor can be varied, a variable resistance setting process can be performed, more specifically, the resistance value of the resistor is set to a large value when the storage capacity of the power storage device to be inspected is small, and is set to a small value when the storage capacity is large. In this manner, the accuracy in calculation of the circuit resistance value can be optimized. Since the accuracy of the circuit resistance value thus measured is high, the inspection time can be further shortened.

According to a method of producing a power storage device according to a second aspect of the disclosure, the power storage device is produced by assembling the power storage device (assembling step), and carrying out the method of inspecting the power storage device according to the first aspect, using the assembled power storage device as an inspection object. Thus, it is possible to manufacture power storage devices, while excluding inferior or defective products in a short time, with high accuracy.

According to the method of inspecting the power storage device as described above, the parasitic resistance value for use in determination of the quality of the power storage device via current measurement is measured within an appropriate measurement time according to other inspection conditions, thus assuring improved accuracy in the inspection as a whole. Also, the method of producing the power storage device, including the same inspecting method, is provided.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
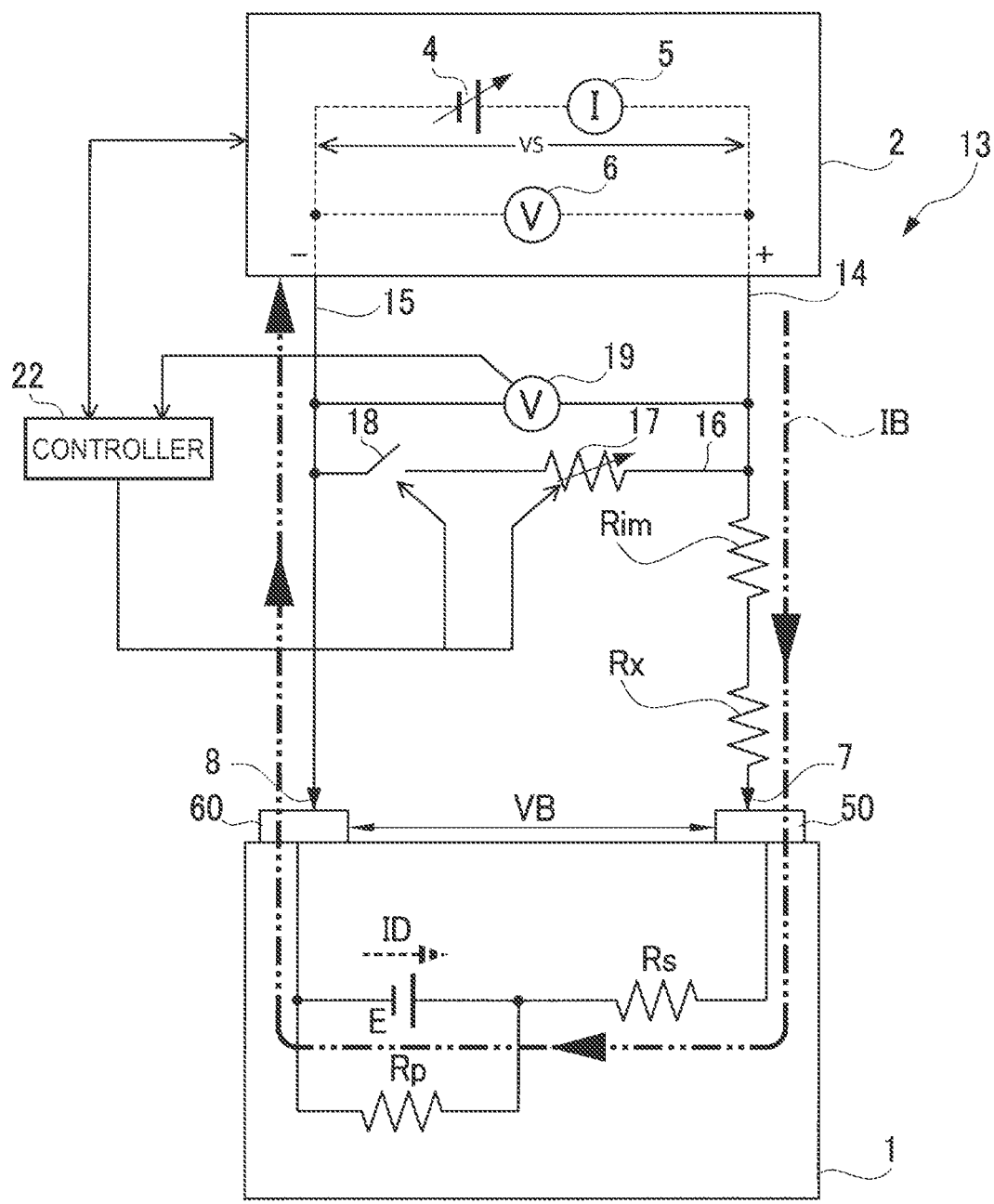
FIG. 1 is a circuit diagram showing the configuration of an inspection system used in one embodiment.

One embodiment of the disclosure will be described in detail with reference to the drawings. In this embodiment, the disclosure is embodied as an inspecting method conducted by using an inspection system 13 illustrated in a circuit diagram of FIG. 1. The inspection system 13 of FIG. 1 has a power-supply unit 2, positive-side conductor 14, negative-side conductor 15, and resistance path 16. The positive-side conductor 14 and the negative-side conductor 15 are respectively connected to a positive terminal and a negative terminal of the power-supply unit 2. Probes 7, 8 are provided at distal ends of the positive-side conductor 14 and negative-side conductor 15, respectively. The resistance path 16 is disposed between the positive-side conductor 14 and the negative-side conductor 15. In the resistance path 16, a resistor 17 and a switch 18 are arranged in series. The resistor 17 is a variable resistor.

The inspection system 13 further has a voltmeter 19. The voltmeter 19 is disposed in parallel with the resistance path 16, between the positive-side conductor 14 and the negative-side conductor 15. The power-supply unit 2 has a direct-current (DC) power supply 4, ammeter 5, and voltmeter 6. The ammeter 5 is arranged in series with the DC power supply 4, and the voltmeter 6 is arranged in parallel with the DC power supply 4. The output voltage VS of the DC power supply 4 can be varied. The DC power supply 4 is used for applying the output voltage VS to a secondary battery 1 in FIG. 1, as will be described later. The ammeter 5 serves to measure electric current flowing in the circuit. The voltmeter 6 serves to measure voltage between the positive-side conductor 14 and the negative-side conductor 15. The voltmeter 19 is located outside the power-supply unit 2, whereas the voltmeter 6 is incorporated in the power-supply unit 2. The DC power supply 4 is not limited to the one having a function of generating electric power by itself, but may be supplied with electric power from the outside for resupply of the power.

The inspection system 13 is further provided with a controller 22. The controller 22 controls the power-supply unit 2, reads an indicated value of the voltmeter 19, and operates the resistor 17 and the switch 18. The control of the power-supply unit 2 by the controller 22 includes operation of the DC power supply 4, and reading of indicated values of the ammeter 5 and voltmeter 6.

Inspection of a power storage device by the inspection system 13 constructed as described above is carried out, in a condition where the power-supply unit 2 is connected to the secondary battery 1 as the power storage device to be inspected, to form a circuit, as shown in FIG. 1. Initially, the basic principle of a method of inspecting the secondary battery 1 by use of the inspection system 13 will be described. In FIG. 1, the probes 7, 8 of the power-supply unit 2 are coupled to terminals 50, 60 of the secondary battery 1, to form a circuit. Further, there is parasitic resistance Rx in the circuit shown in FIG. 1. The parasitic resistance Rx includes conductor resistance of each part of the power-supply unit 2, positive-side conductor 14, and negative-side conductor 15, and contact resistance between the probes 7, 8 and the terminals 50, 60. In FIG. 1, the parasitic resistance Rx is depicted as if it were present only on the positive side, more specifically, on one side of the resistance path 16 closer to the secondary battery 1, for the sake of convenience. In fact, the parasitic resistance Rx is distributed all over the circuit of FIG. 1 including the positive side and the negative side, and further, one side of the resistance path 16 closer to the secondary battery 1 and the other side closer to the power-supply unit 2.

Basic Principle

Figure 2:
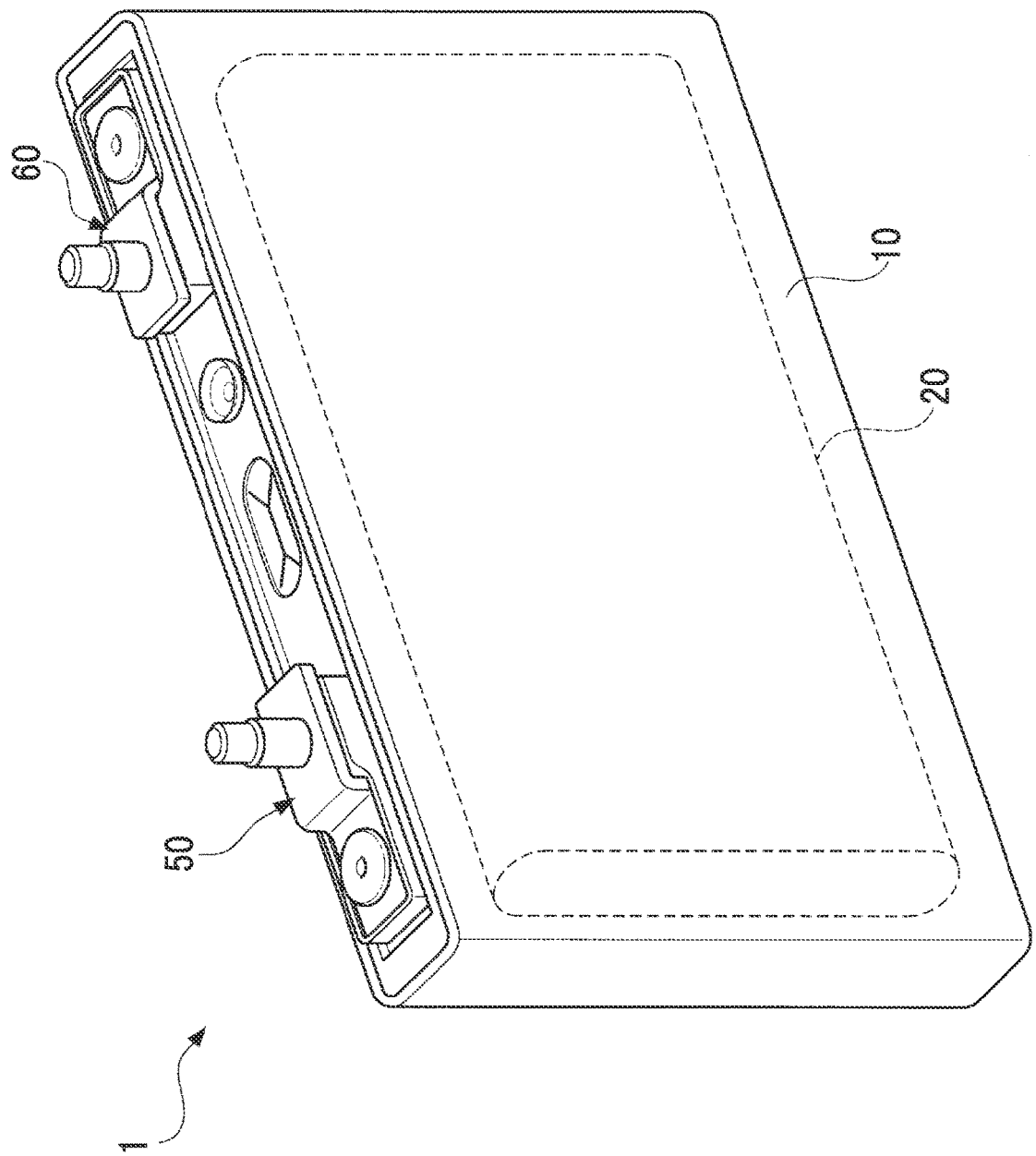
FIG. 2 is an external view showing one example of a secondary battery as an inspection object in the embodiment.

The secondary battery 1, which is schematically illustrated in FIG. 1, actually has an appearance of a flat, rectangular shape as shown in FIG. 2, for example. The secondary battery 1 of FIG. 2 has an electrode laminate 20 incorporated in an outer casing 10. The electrode laminate 20 is formed by laminating a positive electrode plate and a negative electrode plate via a separator. In addition to the electrode laminate 20, an electrolytic solution is also housed in the outer casing 10. The positive and negative terminals 50, 60 are provided on an outer surface of the secondary battery 1. The secondary battery 1 is not limited to the one having the flat, rectangular shape as shown in FIG. 2, but may have another shape, such as a cylindrical shape. The secondary battery 1 is assembled by encapsulating the electrode laminate 20 and the electrolytic solution into the outer casing 10, and mounting the terminals 50, 60 on the outer casing 10.

The secondary battery 1 will be further described. In FIG. 1, the secondary battery 1 is schematically illustrated. The secondary battery 1 in FIG. 1 is represented by a model that consists of an electrogenic element E, internal resistance Rs, and short-circuit resistance Rp. The internal resistance Rs is arranged in series with the electrogenic element E. The short-circuit resistance Rp models a conductive pathway formed from minute metal foreign matters invading into the electrode laminate 20, and is arranged in parallel with the electrogenic element E.

In the inspecting method using the inspection system 13, the secondary battery 1 is inspected in terms of the self-discharge amount. The quality of the secondary battery 1 is inferior when the self-discharge amount is large, and is superior when it is small. Initially, the secondary battery 1 is charged with electric power before it is connected to the power-supply unit 2. Then, the secondary battery 1 that has been charged is connected to the power-supply unit 2, and, in this condition, the self-discharge amount of the secondary battery 1 is calculated by the controller 22. Then, the controller 22 determines whether the quality of the secondary battery 1 is superior or inferior, based on the result of the calculation.

More specifically, the secondary battery 1 that has been charged is connected to the power-supply unit 2. The charged secondary battery 1 connected to the power-supply unit 2 is the one that has gone through high-temperature aging normally conducted after charge, such that the battery voltage is stabilized. In this connection, the inspection itself of this embodiment is conducted at ordinary temperature. After the secondary battery 1 is connected to the power-supply unit 2, the output voltage of the DC power supply 4 is adjusted, so that the reading of the ammeter 5 becomes equal to zero. The output voltage VS at this time is equal to an initial battery voltage VB1 as an initial value of the battery voltage VB of the secondary battery 1.

In this condition, the output voltage VS is equal in quantity to the initial battery voltage VB1, and the output voltage VS and the battery voltage VB of the secondary battery 1 are opposite in direction to each other. Thus, these voltages cancel each other, and the circuit current IB of the circuit becomes equal to zero. Then, the secondary battery 1 is left to stand while the output voltage VS of the power-supply unit 2 is kept constant at the initial battery voltage VB1.

Figure 3:
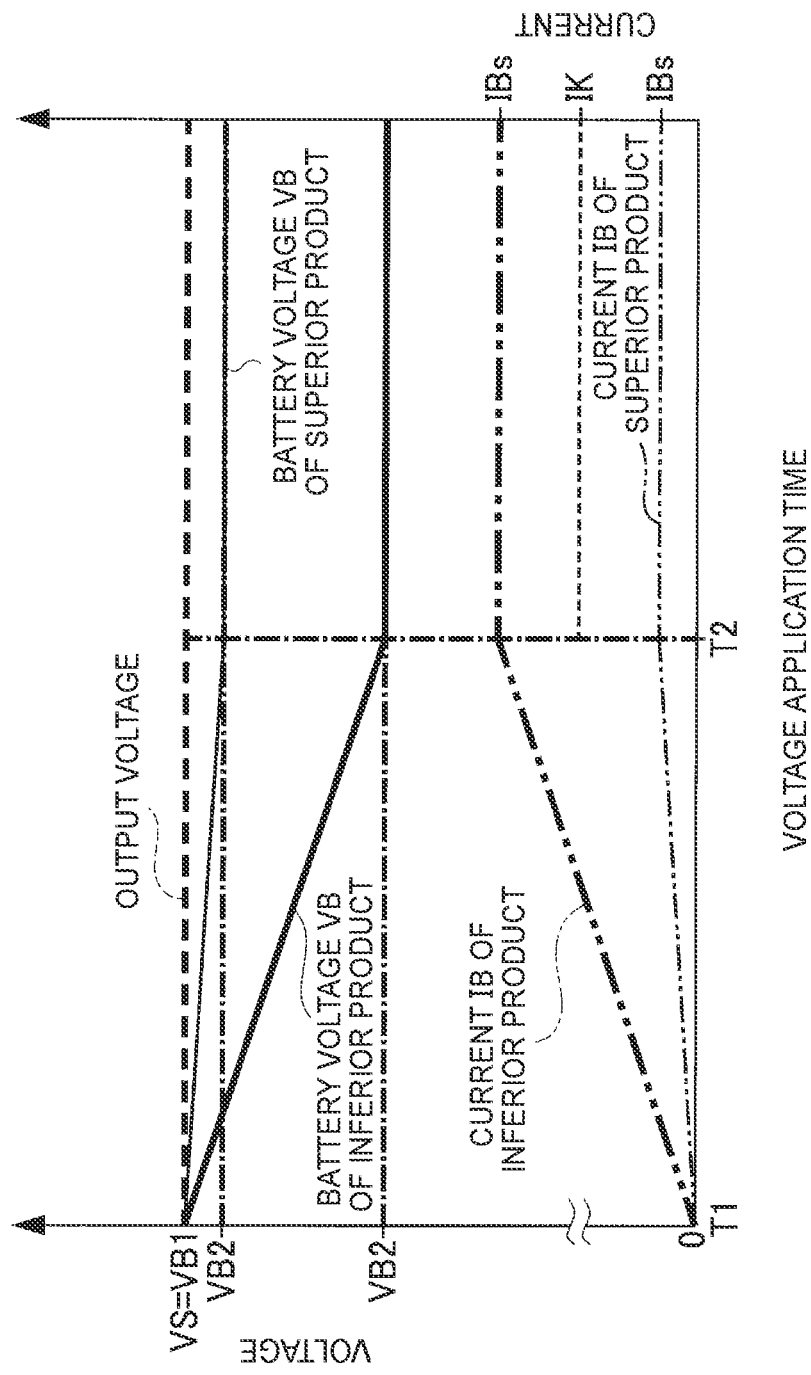
FIG. 3 is a graph indicating chronological changes of voltage and current in the inspection of the embodiment.

FIG. 3 shows subsequent conditions of the circuit 3. In FIG. 3, the horizontal axis denotes time, and the vertical axes denote voltage (on the left side) and current (on the right side). On the horizontal axis, time T1 at the left end in FIG. 3 is a point in time at which the output voltage VS equal to the initial battery voltage VB1 starts being applied. After time T1, the battery voltage VB is gradually reduced from the initial battery voltage VB1, due to self-discharge of the secondary battery 1. As a result, the output voltage VS and the battery voltage VB lose balance, and circuit current IB flows in the circuit. The circuit current IB gradually increases from zero. The circuit current IB is directly measured by the ammeter 5. Then, at time T2 posterior to time T1, the decreasing battery voltage VB and the increasing circuit current IB reach saturated levels, and both the battery voltage VB and the circuit current IB become constant (VB2, IBs).

As is apparent from FIG. 3, in the secondary battery 1 that is an inferior product, the increase of the circuit current IB and the reduction of the battery voltage VB are both steeper than those of the secondary battery 1 that is a superior product. Thus, a circuit current IBs reached after convergence of the circuit current IB in the case of the inferior secondary battery 1 is larger than a circuit current IBs reached after convergence in the case of the superior secondary battery 1. Also, the battery voltage VB2 reached after convergence of the battery voltage VB in the case of the inferior secondary battery 1 is lower than the battery voltage VB2 reached after convergence in the case of the superior secondary battery 1.

The reason why the conditions of the circuit after time T1 are those as shown in FIG. 3 will be described. Initially, the battery voltage VB is reduced because of self-discharge of the secondary battery 1 as described above. Due to the self-discharge, a self-discharge current ID flows through the electrogenic element E of the secondary battery 1. The self-discharge current ID is larger as the self-discharge amount of the secondary battery 1 is larger, and is smaller as the self-discharge amount is smaller. In the secondary battery 1 having a small value of the short-circuit resistance Rp, the self-discharge current ID tends to be large.

On the other hand, the circuit current IB that flows due to reduction of the battery voltage VB after time T1 flows in such a direction as to charge the secondary battery 1. Namely, the circuit current IB acts in such a direction as to curb self-discharge of the secondary battery 1, and is opposite in direction to the self-discharge current ID in the interior of the secondary battery 1. Then, when the circuit current IB increases to be equal in quantity to the self-discharge current ID, self-discharge substantially stops, at time T2. After time T2, both the battery voltage VB and the circuit current IB become constant (VB2, IBs). Whether the circuit current IB has converged or not may be determined by a known method. For example, a value of the circuit current IB may be sampled at an appropriate frequency, and convergence of the circuit current IB may be determined when a change of the value becomes smaller than a predetermined criterion.

Here, the circuit current IB can be directly grasped as a reading of the ammeter 5 as described above. Thus, it is possible to determine whether the quality of the secondary battery 1 is superior or inferior, by setting a criterial value IK for the circuit current IBs after convergence. The secondary battery 1 is an inferior product of which the self-discharge amount is large, when the circuit current IBs after convergence is larger than the criterial value IK. The secondary battery 1 is a superior product of which the self-discharge amount is small, when the circuit current IBs is smaller than the criterial value IK.

The required processing time (time T1→time T2) in the above determining method is shorter than the standing time in the method as described above in "BACKGROUND". Also, the determination accuracy is high because the above method uses current measurement. It is not preferable to determine the quality of the secondary battery 1 by using the battery voltage VB2 after convergence in FIG. 3. This is because the battery voltage VB does not necessarily appear correctly as a reading of the voltmeter 6. Heretofore, the basic principle of the method of inspecting the secondary battery 1 using the inspection system 13 has been described. In production of the secondary battery 1, an initial charging step of initially charging the secondary battery 1 that has been assembled but has not been charged, to a predetermined state of charge, to provide the secondary battery 1 that has been charged, and an inspecting step of inspecting the secondary battery 1 that has been charged, may be carried out. In the inspecting step, the inspecting method as described above may be performed.

In the above description, the output voltage VS of the DC power supply 4 is controlled to be constant. However, the output voltage VS is not necessarily required to be constant. Rather, the processing time required for determination can be further shortened, by appropriately changing the output voltage VS, as described below.

Figure 4:
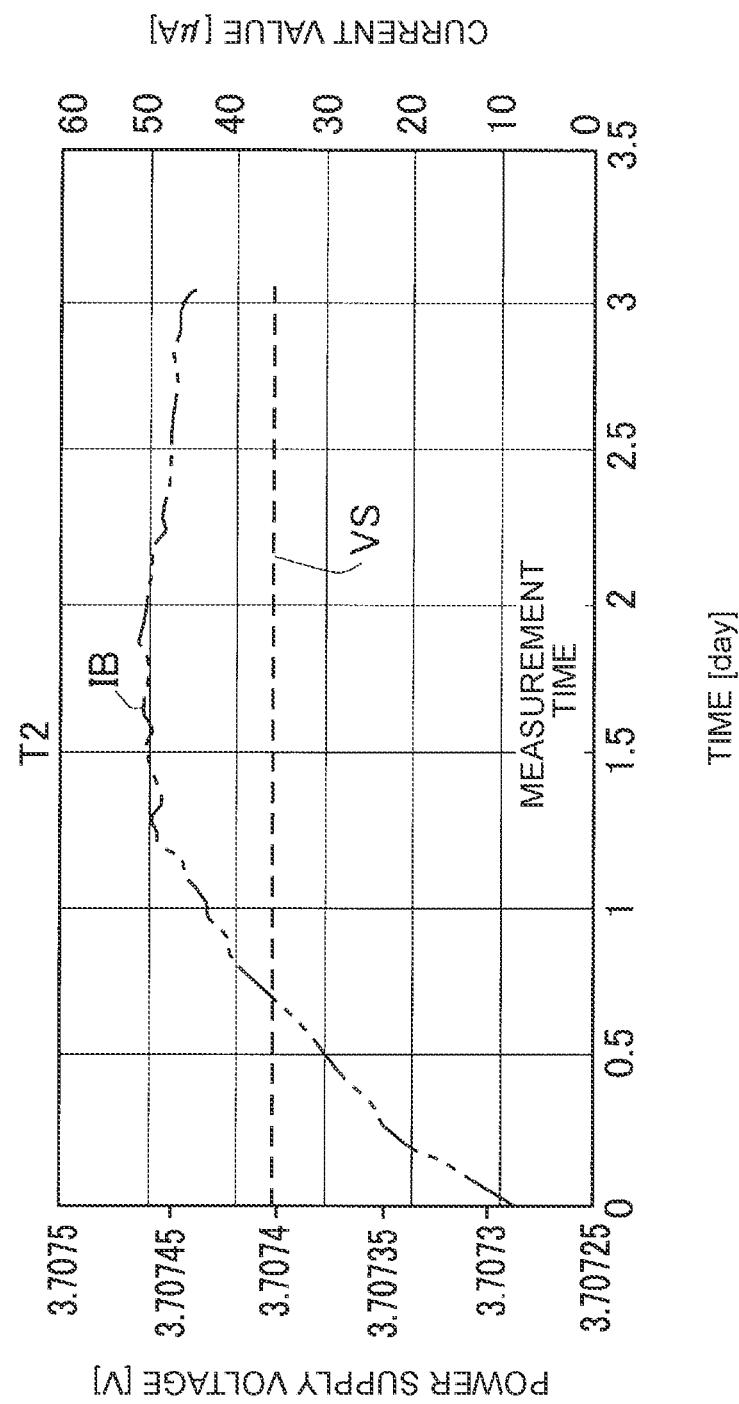
FIG. 4 is a graph showing an example of transition of circuit current when the output voltage is constant.
Figure 5:
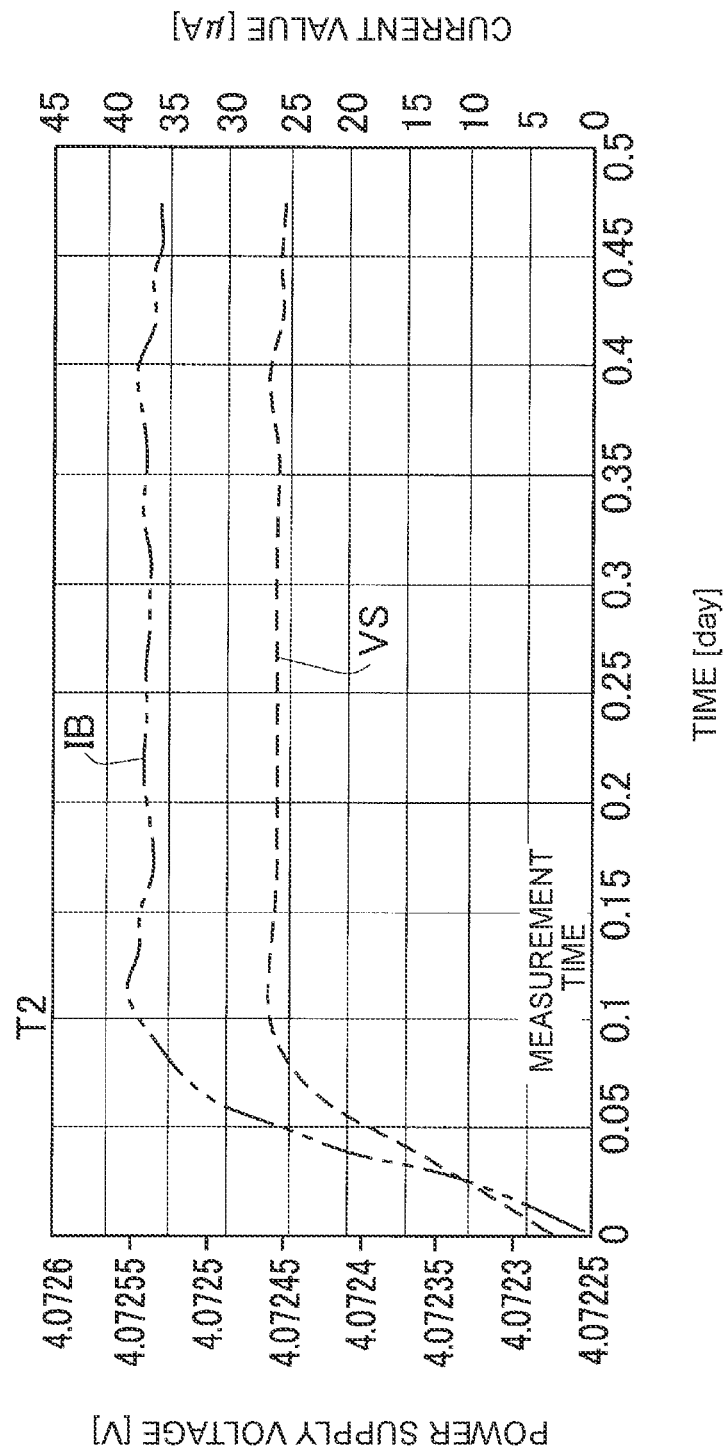
FIG. 5 is a graph showing an example of transition of the circuit current when the output voltage is increased.

Referring to FIG. 4 and FIG. 5, an advantage yielded by changing the output voltage VS will be discussed. FIG. 4 shows one example of transition of the actual circuit current IB when the output voltage VS is held constant as described above. In the example of FIG. 4, the output voltage VS is held constant at an initially determined value, and it takes about one and a half days for the circuit current IB to converge (time T2). Although one and a half days in FIG. 4 is sufficiently shorter than the processing time required in the case of determination via voltage measurement, the required processing time can be further shortened by changing the output voltage VS, as in an example of FIG. 5. In the example of FIG. 5, the output voltage VS is increased, and the circuit current IB becomes converged within only 0.1 day.

The case where the output voltage VS is increased as shown in FIG. 5 will be further described. Initially, the circuit current IB in the circuit of FIG. 1 is given by the following equation (1), using the output voltage VS of the DC power supply 4, battery voltage VB, and parasitic resistance Rx.

$$IB=(VS-VB)/Rx \tag{1}$$

Where the output voltage VS is constant, the circuit current IB increases with reduction of the battery voltage VB due to self-discharge of the secondary battery 1, as described above. When the circuit current IB increases to be equal to the self-discharge current ID, discharge of the secondary battery 1 is substantially stopped. As a result, both the battery voltage VB and the circuit current IB become constant (VB2, IBs), as described above. Namely, the circuit current IBs after convergence indicates the self-discharge current ID of the electrogenic element E of the secondary battery 1.

Where the output voltage VS is increased, too, the above equation (1) is similarly satisfied. However, as the output voltage VS increases, the circuit current IB increases faster than that in the case where the output voltage VS is constant. Thus, the required time it takes until the circuit current IB becomes equal to the self-discharge current ID is shortened. This is because the circuit current IB converges early as described above. However, if the output voltage VS is increased haphazardly, it may be increased too much. In this case, the circuit current IB may not converge appropriately, and the determination may not be made. Thus, it is necessary to limit the degree of increase of the output voltage VS. Specifically, in this embodiment, the output voltage VS is increased within a range in which the parasitic resistance Rx appears as if it were reduced in Eq. (1). This is because the circuit current IB increases as the parasitic resistance Rx is reduced.

Thus, in this embodiment, a concept of imaginary resistance Rim is introduced, as shown in FIG. 1. The imaginary resistance Rim has a negative or zero resistance value. In the circuit diagram of FIG. 1, the imaginary resistance Rim is inserted in series with the parasitic resistance Rx. In fact, there is no such resistance, but a situation where the output voltage VS increases is replaced with a model in which the output voltage VS is held constant, but instead the absolute value of the resistance value of the imaginary resistance Rim increases, and this model will be examined. In this connection, the sum of the parasitic resistance Rx and the imaginary resistance Rim is reduced, but must be a positive value. In the following description, the sum of the parasitic resistance Rx and the imaginary resistance Rim will be called "pseudo parasitic resistance Ry". The circuit current in the model into which the pseudo parasitic resistance Ry is introduced is expressed as indicated in the following equation (2).

$$IB=(VS-VB)/(Rx+Rim) \qquad (2)$$

Suppose that the parasitic resistance Rx is 5Ω. Then, the circuit current IB differs between the case where the imaginary resistance Rim is 0Ω and the case where it is −4Ω. Namely, the circuit current IB in the case of −4Ω (corresponding to a point in time after start of the measurement) is five times as large as the circuit current IB in the case of 0Ω (corresponding to the time of start of the measurement), according to Eq. (2). This is because the pseudo parasitic resistance Ry (=Rx+Rim) is reduced to be one-fifth of the initial value.

The following equation (3) is obtained by modifying the above equation (2).

$$VS=VB+(Rx+Rim)*IB \qquad (3)$$

The above equation (3) indicates that the output voltage VS is obtained by adding the product of the pseudo parasitic resistance Ry and the circuit current IB to the battery voltage VB. Since the imaginary resistance Rim, out of the pseudo parasitic resistance Ry, is actually not present as described above, Eq. (3) is satisfied by raising the output voltage VS to a voltage obtained by adding the product of the parasitic resistance Rx and the circuit current IB to the battery voltage VB. Namely, a value obtained by dividing the amount of increase of the output voltage VS by the circuit current IB corresponds to the absolute value of the imaginary resistance Rim.

When the measurement is started in a condition where the output voltage VS is made equal to the initial battery voltage VB1 as described above, the output voltage VS is increased according to Eq. (3) in accordance with the circuit current IB at that point in time, at an appropriate frequency. The frequency at which the output voltage VS is increased is about once per second, for example. The frequency need not be constant. As a result, the amount of increase of the output voltage VS is larger as the increase of the circuit current IB after start of inspection is larger. Also, the output voltage VS stops increasing when the circuit current IB stops increasing. Thus, the measurement as shown in FIG. 5 can be implemented.

The amount of increase of the output voltage VS relative to the increase of the circuit current IB is the product of the parasitic resistance Rx and the circuit current IB, as is understood from the above description. Namely, where ΔVS denotes the amount of increase of the output voltage VS, the amount of increase ΔVS is given by the following equation (4).

$$\Delta VS=Rx*IB \qquad (4)$$

However, the manner of obtaining the amount of increase ΔVS is not limited to this, but the amount of increase ΔVS may be obtained by multiplying the product of Eq. (4) by a positive coefficient K that is less than one. A specific value of the coefficient K may be any given value within the above range, and may be determined in advance. Namely, the amount of increase ΔVS may be calculated according to the following equation (5).

$$\Delta VS=K*Rx*IB \qquad (5)$$

The product of the coefficient K and the parasitic resistance Rx may be obtained in advance as a constant M, and the amount of increase ΔVS of the output voltage VS may be calculated by multiplying the circuit current IB by the constant M. In this case, the output voltage VS during the inspection is calculated according to the following equation (6).

$$VS=VB+M*IB \qquad (6)$$

With the object of settling or finishing increase of the circuit current IB early, it is most effective to use the product of Eq. (4) as it is as the amount of increase of the output voltage VS. However, in this case, the pseudo parasitic resistance Ry may become a negative value, because of the accuracy in the value of the parasitic resistance Rx, and for other reasons. In this situation, change of the circuit current IB may diverge, and required measurement may not be conducted. Then, the risk of divergence can be reduced, by multiplying the product of the parasitic resistance Rx and the circuit current IB, by the coefficient K as described above.

If the coefficient K assumes a large value (close to one), it means that the absolute values of the imaginary resistance Rim and parasitic resistance Rx are close to each other, and the pseudo parasitic resistance Ry is small. This means that the output voltage VS increases rapidly. In this case, the circuit current IB can be expected to converge in a short time, but there is a large risk of divergence, depending on the accuracy of the parasitic resistance Rx. If the coefficient K assumes a small value (remote from one), the pseudo parasitic resistance Ry is large, and the output voltage VS increases slowly. Namely, it takes a long time to converge the circuit current IB, but the risk of divergence is small even if the accuracy of the parasitic resistance Rx is low.

Thus, in order to actually conduct the measurement under this control, it is necessary to be aware of the value of the parasitic resistance Rx with high accuracy. The contact resistance between the probes 7, 8 and the terminals 50, 60, as a portion of the parasitic resistance Rx, differs each time the circuit 3 is assembled. Therefore, the value of the parasitic resistance Rx is measured each time the probes 7, 8 are placed against the terminals 50, 60. In the inspection system 13 of FIG. 1, the value of the parasitic resistance Rx can be accurately measured.

Measurement of Parasitic Resistance

The procedure of measuring the parasitic resistance Rx in the inspection system 13 of FIG. 1 will be described. This measurement is conducted by the controller 22, in a condition where the probes 7, 8 are in contact with the terminals 50, 60 of the secondary battery 1 to be inspected. The output voltage VS of the power-supply unit 2 is set to zero. With regard to the resistor 17, the variable resistance function is not used, but the resistance value is fixed. The manner of using the variable resistance function of the resistor 17 will be described later.

The procedure of measuring the parasitic resistance Rx in the inspection system 13 is, in short, to obtain indicated values of the voltmeter 19 in a condition where the switch 18 is open and in a condition where the switch 18 is closed. In this manner, the value of the parasitic resistance Rx can be measured. Namely, the value of the parasitic resistance Rx is calculated according to the following equation (7).

$$Rx=(V0-V1)*(R1/V1) \quad (7)$$

R1: resistance value of the resistor 17
V0: indicated value of the voltmeter 19 when the switch 18 is open (OFF)
V1: indicated value of the voltmeter 19 when the switch 18 is closed (ON)

The above equation (7) is derived in the following manner. Initially, when the switch 18 is open (OFF), V0 is the battery voltage VB of the secondary battery 1. When the switch 18 is closed (ON), the circuit current IB in this condition is given by the following equation.

$$IB=VB/(R1+Rx)$$

V1 is the product of the resistance value R1 of the resistor 17 and the circuit current IB, and is thus expressed as follows.

$$V1=R1*VB/(R1+Rx)=R1*V0/(R1+Rx)$$

The above equation (7) is obtained by solving this equation with respect to Rx. Thus, in this embodiment, the parasitic resistance Rx of the circuit is precisely measured. The inspection using the self-discharge amount is conducted while the probes 7, 8 are not disconnected from but kept in contact with the terminals 50, 60, after the parasitic resistance Rx is precisely measured. In this manner, the inspection time can be further shortened. This is because a value that is as close to one as possible can be used as the above-mentioned coefficient K upon introduction of the imaginary resistance Rim, since the parasitic resistance Rx is measured with high accuracy. Thus, the output voltage VS can be increased and converged early after start of the inspection, so that the determination can be made.

In the above procedure, V0 and V1 may be measured by using the voltmeter 6 incorporated in the power-supply unit 2, in place of the voltmeter 19. Namely, if the voltmeter 6 is incorporated in the power-supply unit 2, the above measurement can be carried out without the voltmeter 19. Also, while the output voltage VS of the power-supply unit 2 is set to zero in the above procedure, this is not essential. Even when the output voltage VS is not equal to zero, V0 and V1 can be measured if the output voltage VS when the switch 18 is open is equal to the output voltage VS when the switch 18 is closed. In this case, however, V0 and V1 are preferably measured with the voltmeter 19.

Here, an effect obtained by precisely measuring the parasitic resistance Rx will be described. As the accuracy in measurement of the parasitic resistance Rx is higher, the pseudo parasitic resistance Ry can be reduced to a minimum. If the absolute value of the imaginary resistance Rim is set to a value close to the parasitic resistance Rx when the accuracy in measurement of the parasitic resistance Rx is low, there is a risk that the actual pseudo parasitic resistance Ry becomes equal to zero or negative. This risk is small when the accuracy in measurement of the parasitic resistance Rx is high. Namely, as the accuracy in measurement of the parasitic resistance Rx is higher, the secondary battery 1 can be inspected in a condition where the absolute value of the imaginary resistance Rim is set to be as close to the parasitic resistance Rx as possible. As a result, the inspection time can be shortened.

Figure 6:
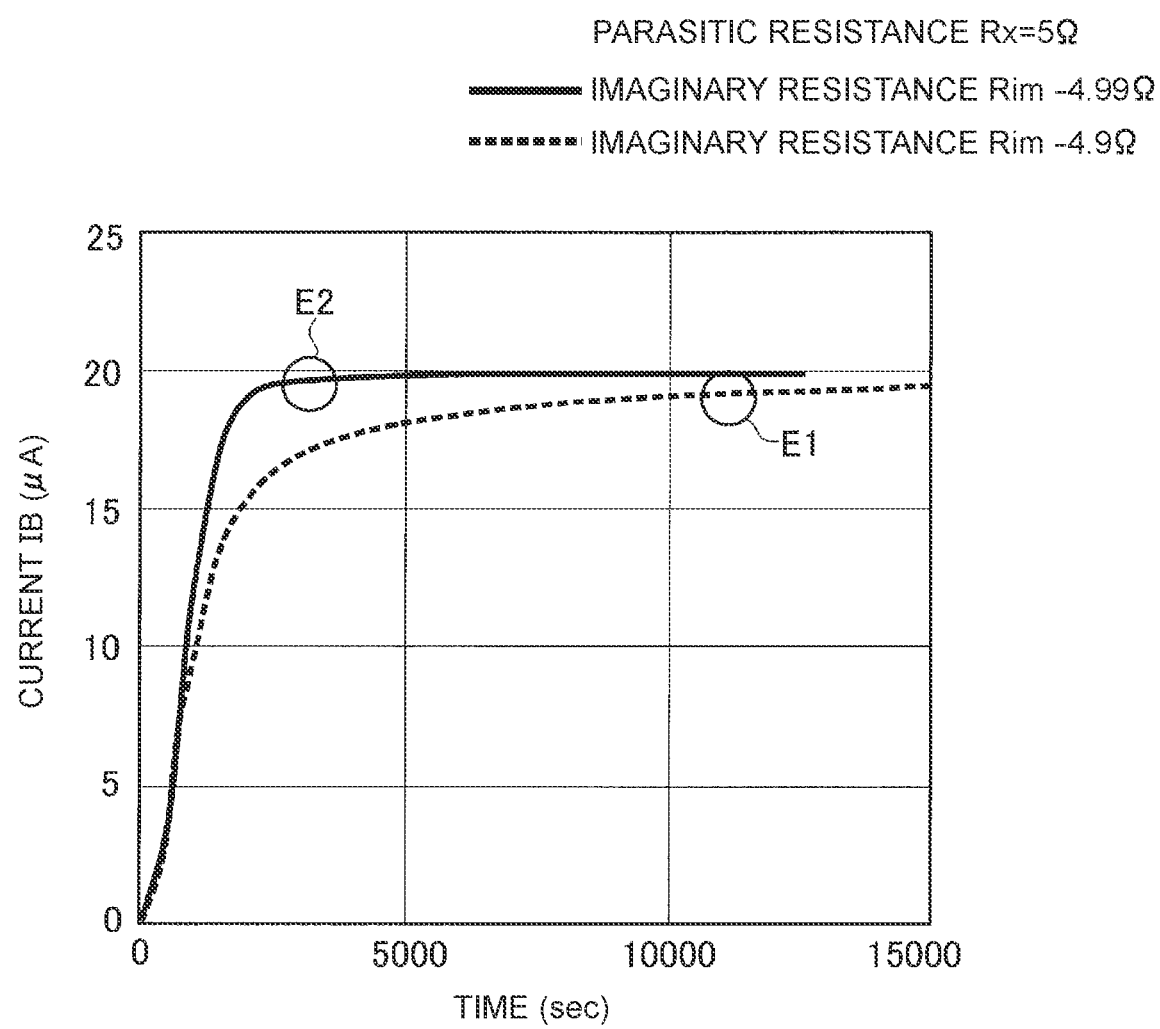
FIG. 6 is a graph indicating a difference in a converging condition of circuit current due to a difference in imaginary resistance.

In the graphs of FIG. 6, convergence conditions of the circuit current IB after start of the inspection, with respect to two levels of imaginary resistance Rim, are indicated. The graphs shown in FIG. 6 represent measurement examples under the following conditions.

Type of the secondary battery 1: lithium-ion secondary battery
Storage capacity of the secondary battery 1: 35 Ah
Positive-electrode active material: ternary composite lithium salt
Negative-electrode active material: graphite
Electrolyte of electrolytic solution: $LiPF_6$
Solvent of electrolytic solution: three-in-one solvent containing carbonate
Parasitic resistance Rx: 5 Ω

FIG. 6 shows two graphs, i.e., a graph indicated by a solid line and corresponding to the case where the imaginary resistance Rim is equal to −4.99 Ω (namely, the pseudo parasitic resistance Ry is 0.01Ω, or the coefficient K is 0.998), and a graph indicated by a broken line and corresponding to the case where the imaginary resistance Rim is equal to −4.9 Ω (namely, the pseudo parasitic resistance Ry is 0.1Ω, or the coefficient K is 0.98). Referring to the graph indicated by the broken line, the circuit current IB converges within about three hours after start of the inspection (see a circle labelled "E1"). It can be said that the circuit current IB converges much more rapidly, as compared with the case where the imaginary resistance Rim is not introduced, namely, where the output voltage VS is set to be constant after start of the inspection. The graph indicated by the solid line represents a measurement example in which the pseudo parasitic resistance Ry is further reduced. In this example, the convergence time is about one hour (see a circle labelled "E2"), which is further shorter than that in the case of the broken line. Thus, the inspection time can be shortened by reducing the pseudo parasitic resistance Ry.

Procedure of Inspection

Respective steps of the inspection performed by the inspection system 13 of this embodiment are listed in chronological order, as follows.

(1) Setting the secondary battery 1 to be inspected, in the inspection system 13
(2) Setting the ON time
(3) Measuring voltage V0 (calculating parasitic resistance Rx)
(4) Measuring voltage V1 (calculating parasitic resistance Rx)
(5) Setting imaginary resistance Rim
(6) Measuring self-discharge (carrying out the inspection)

When the secondary battery 1 is set in place in step (1), the switch 18 is placed in the OFF position. The "setting the ON time" in step (2) is to determine a period of time (ON time) from when the switch 18 is placed in the ON position for step (4) to when the switch 18 is switched to OFF again, as will be described in detail later. In step (3), the indicated value of the voltmeter 19 is obtained while the switch 18 is kept in the OFF position. In step (4), the indicated value of the voltmeter 19 is obtained after the switch 18 is switched to ON. In step (5), the degree by which the output voltage VS of the power-supply unit 2 is increased in step (6) is set. To this end, the concept of the imaginary resistance Rim as described above is used. Then, in step (6), the inspection is carried out by measuring the circuit current IB.

Among the above steps, step (2), i.e., "setting the ON time", will be described. When the switch 18 is placed in the ON position (i.e., the switch 18 is closed) for step (4), the secondary battery 1 is discharged, by an amount corresponding to the current flowing through the resistance path 16. Thus, while the switch 18 is in the ON position, the battery voltage VB is reduced little by little. Then, when the switch 18 is returned to OFF, namely, when discharge via the resistance path 16 is finished, the battery voltage VB rebounds and increases.

Figure 7:
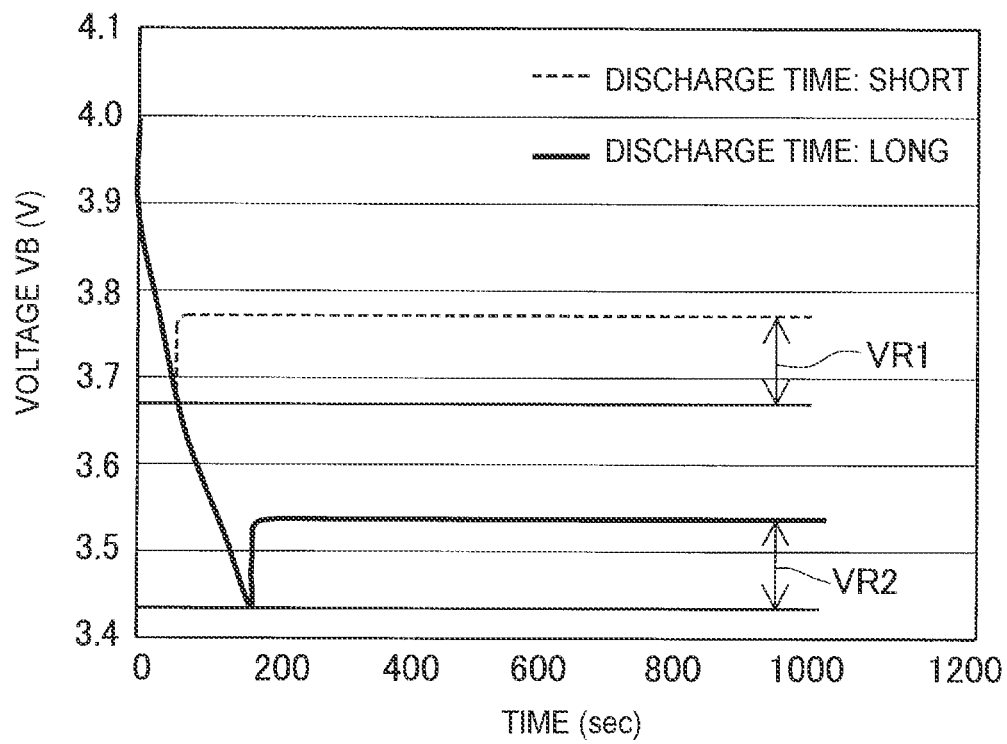
FIG. 7 is a graph showing change of battery voltage due to a temporary discharge.

FIG. 7 shows this situation. In FIG. 7, the horizontal axis indicates time (sec.), and a point (left end) indicating zero second represents a moment at which the switch 18 is switched from OFF to ON. After this point in time, the battery voltage VB changes in a decreasing direction. The battery voltage VB on the vertical axis keeps decreasing while the switch 18 is ON, and reaches the lowest value at a moment when the switch 18 is returned to OFF. Then, the battery voltage VB immediately increases a little. In FIG. 7, two patterns, namely an example in which the ON time is set to a relatively short time (about 1 min.) and an example in which the ON time is set to a relatively long time (about 3 min.), are shown.

When rebound amounts VR1, VR2 of the battery voltage VB after the switch 18 is placed in the OFF position in both patterns are compared with each other, the rebound amount VR2 obtained when the ON time is long is larger than the rebound amount VR1 obtained when the ON time is short. In the case where the same secondary battery 1 is used, the rebound amount is likely to be larger as the ON time is larger. As the rebound amount of the battery voltage VB is larger, the accuracy in current measurement in subsequent step (6) is lower. Namely, the shorter ON time is preferred, for the sake of high accuracy in current measurement of step (6). Also, the shorter ON time is preferred, in terms of reduction of the total required time of the inspection. In the meantime, the voltage measurement of step (4) needs to be carried out during the ON time. Thus, if the ON time is too short, the accuracy in measurement of the voltage V1 is reduced, due to a problem in the response speed of the voltmeter 19. Thus, the ON time needs to be long enough to provide sufficiently high accuracy in measurement of the voltage V1.

Figure 8:
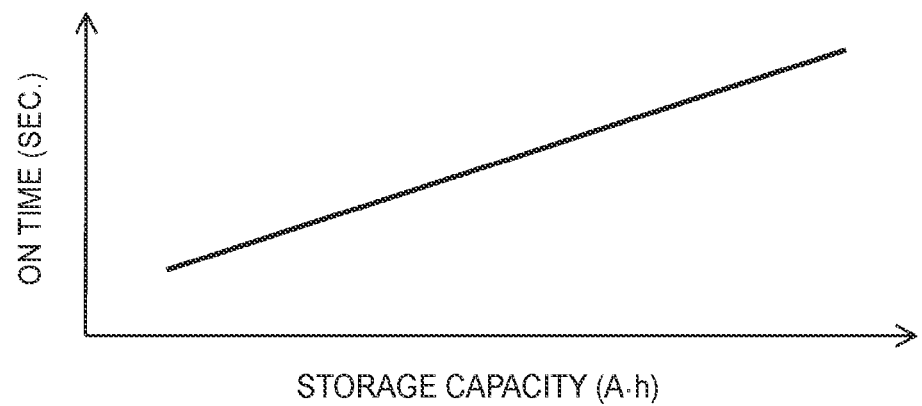
FIG. 8 is a graph (No. 1) showing an example of the relationship between the set ON time and the storage capacity of the secondary battery to be inspected.
Figure 9:
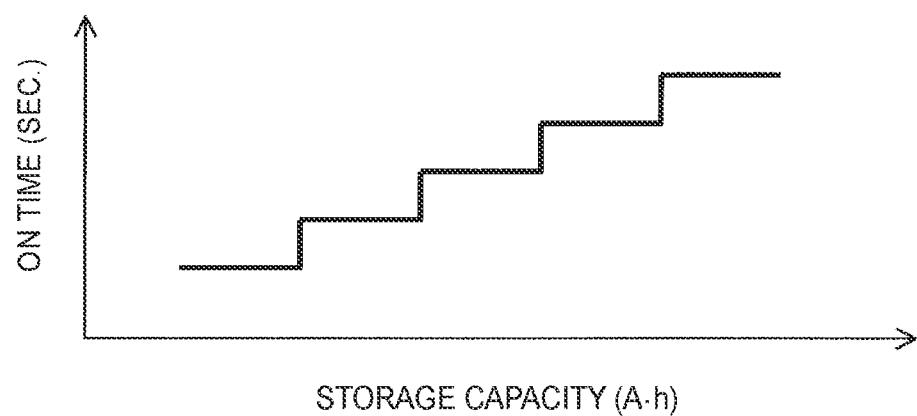
FIG. 9 is a graph (No. 2) showing an example of the relationship between the set ON time and the storage capacity of the secondary battery to be inspected.

The two examples shown in FIG. 7 are concerned with the same secondary battery 1. In fact, a pattern of change of the battery voltage VB after the switch 18 is switched to ON is influenced not only by the length of the ON time, but also by the storage capacity of the secondary battery 1. As the storage capacity of the secondary battery 1 is larger, an influence on the battery voltage VB due to discharge of a given amount of electric power is smaller. The storage capacity of the secondary battery 1 is known information available from specifications of the secondary battery 1 to be inspected. Thus, the ON time nay be set according to the storage capacity of the secondary battery 1. Namely, the length of the ON time is set to be longer in the case of large capacity than that in the case of small capacity, and is set to be shorter in the case of small capacity than that in the case of large capacity. A specific relationship between the ON time and the storage capacity may be a linear relationship as shown in FIG. 8, or a stepwise relationship as shown in FIG. 9, for example. The relationship as shown in FIG. 8 or FIG. 9 may be stored in advance in the controller 22.

In the manner as described above, the ON time can be appropriately set according to the storage capacity of the secondary battery 1. Namely, the ON time is set to a relatively long time when the secondary battery 1 has a large capacity. However, the rebound amount of the battery voltage VB after the switch 18 is switched to OFF is not so large because of the large capacity. On the other hand, the ON time is set to a relatively short time when the secondary battery 1 has a small capacity. As a result, the rebound amount of the battery voltage VB is relatively small. Thus, the rebound amount of the battery voltage VB after the switch 18 is switched to OFF does not vary so much, depending on the magnitude of the storage capacity of the secondary battery 1. Therefore, substantially the same determination accuracy can be expected irrespective of the storage capacity of the secondary battery 1.

Although the vertical axis of FIG. 7 has a significantly expanded scale, the battery voltage VB during the ON time is not constant. Thus, strictly speaking, the voltage V1 measured in step (4) is influenced by the measurement timing during the ON time. Thus, it is desirable to designate, in advance, the measurement timing of the voltage V1 during the ON time, for example, using the proportion to the length of the ON time. Also, the voltage V0 may be measured in step (3) before the switch 18 is switched to ON, or after the ON time ends. In the latter case, it is desirable to measure the voltage V0 after further waiting for the end of rebounding of the battery voltage VB, after the switch 18 is switched to OFF.

It is more preferable to further add adjustment according to the resolution of the voltmeter 19 to "setting of the ON time". As the resolution of the voltmeter 19 is higher, the voltages V0, V1 can be measured with higher accuracy. Thus, if the resolution of the voltmeter 19 is high, a significant voltage difference (V0−V1) is obtained even if a difference between the voltage V0 and the voltage V1 is small. Accordingly, when the resolution of the voltmeter 19 is high, it is not necessary to secure such a long ON time. The resolution of the voltmeter 19 is, of course, known information available from the specifications of the voltmeter 19. Thus, the ON time may be set according to the resolution of the voltmeter 19. Namely, the length of the ON time is set to be shorter in the case where the voltage resolution is high, than that in the case where it is low, and is set to be longer in the case where the voltage resolution is low, than that in the case where it is high.

Figure 10:
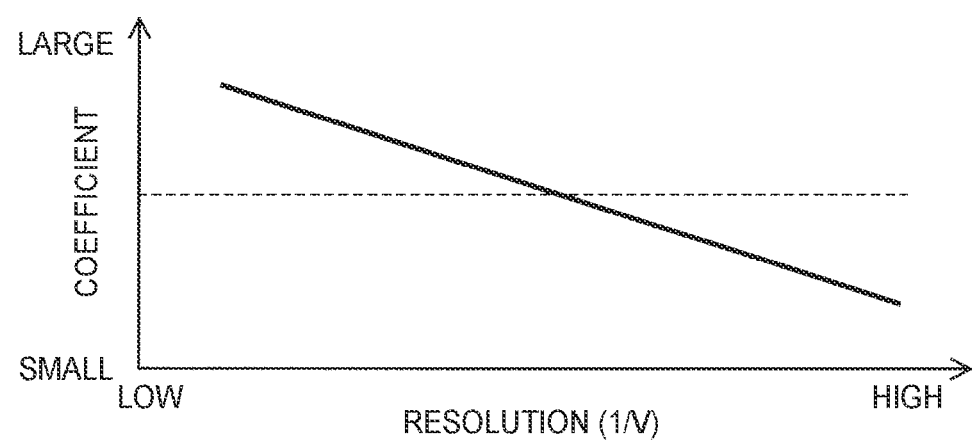
FIG. 10 is a graph showing an example of the relationship between a coefficient by which the ON time is multiplied, and a resolution of a voltmeter.

More specifically, the ON time determined from the storage capacity using FIG. 8 or FIG. 9 is shortened when the voltage resolution is high, and is extended when the voltage resolution is low. For example, this adjustment can be made by multiplying the ON time determined in FIG. 8 or FIG. 9, by a coefficient determined based on the voltage resolution as shown in FIG. 10. The relationship of FIG. 10 may also be stored in advance in the controller 22. The relationship of FIG. 10 may be replaced with that of a stepwise pattern. When the voltages V0, V1 are read on the voltmeter 6, the coefficient is determined based on the voltage resolution of the voltmeter 6.

By measuring the voltages V0, V1 according to the ON time set in the above manner, it is possible to calculate the parasitic resistance Rx with high accuracy. Thus, the above-indicated coefficient K can be set to a value closest possible to 1, and the inspection of step (6) can be carried out in a short time.

Variable Resistance Function of Resistor 17

Heretofore, the resistance value R1 of the resistor 17 has not been discussed. However, in fact, the inspection time can be further shortened by setting the resistance value R1 of the resistor 17 to an optimum value. The optimum resistance value R1 of the resistor 17 depends on the storage capacity of the secondary battery 1. This will be described with reference to FIG. 11 and FIG. 12.

Figure 11:
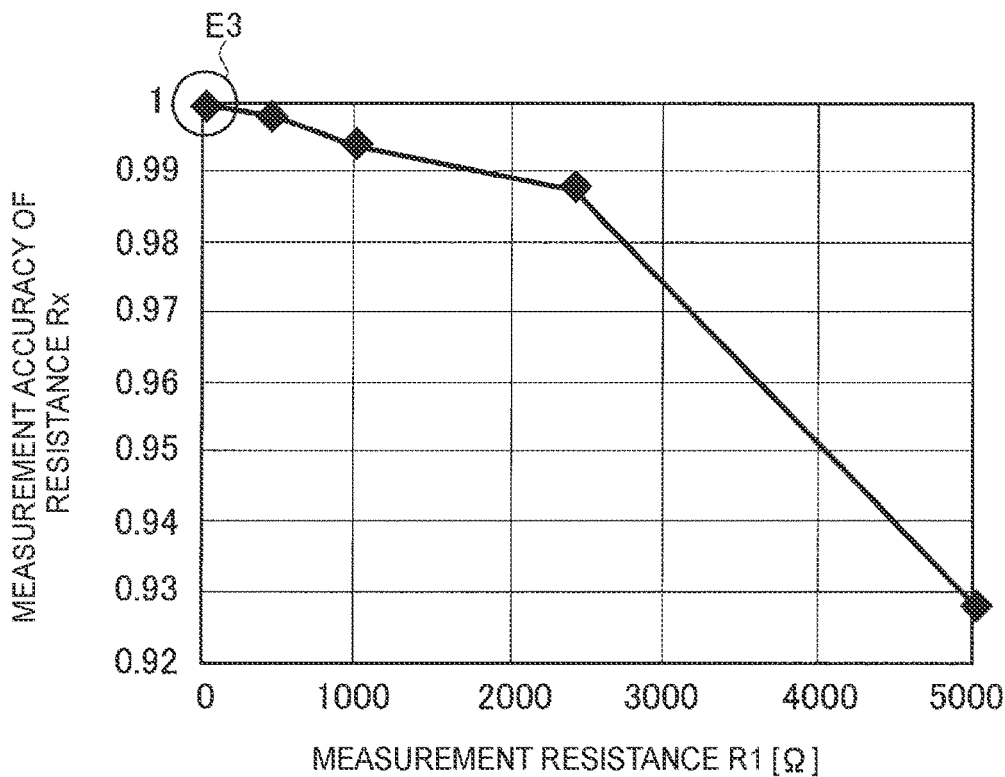
FIG. 11 is a graph indicating the relationship between a resistance value of a resistance path, and the accuracy in measurement of parasitic resistance.

FIG. 11 shows a graph indicating the accuracy of the parasitic resistance Rx calculated by the method of the above "measurement 1", when the resistance value R1 is varied. As is apparent from FIG. 11, the measurement accuracy is lower as the resistance value R1 is larger. This is because the parasitic resistance Rx is around several dozens of ohms (Ω), and is not so large. When the switch 18 is placed in the ON position and the voltage V1 is measured in "measurement 1", the parasitic resistance Rx and the resistor 17 (resistance value R1) are connected in series. In this condition, the circuit current IB is determined by the sum of the parasitic resistance Rx and the resistance value R1. When the resistance value R1 is set to around several thousands of ohms (Ω) as shown in FIG. 11, the circuit current IB is substantially determined by the resistance value R1. Thus, in this setting, the degree of dependence of the voltage V1 on the parasitic resistance Rx is low, and the accuracy in measurement of the parasitic resistance Rx is also low. At the left-hand side of FIG. 11, namely, when the resistance value R1 is low, the degree of dependence of the voltage V1 on the parasitic resistance Rx is relatively high, and the measurement accuracy is also high.

However, it is not always true that the lower the resistance value R1, the better. A portion of the graph of FIG. 11 encircled by a circle E3 at the left, upper corner of FIG. 11 is enlarged and shown in FIG. 12. If the resistance value R1 is extremely low, the measurement accuracy is reduced, as indicated by an arrow E4 in FIG. 12. This is because, when the resistance value R1 is extremely low, the secondary battery 1 is brought into a condition equivalent to short-circuiting between its opposite terminals when the switch 18 is placed in the ON position. As a result, large circuit current IB flows, and the voltage VB of the secondary battery 1 drops. Consequently, highly accurate measurement cannot be conducted.

Figure 12:
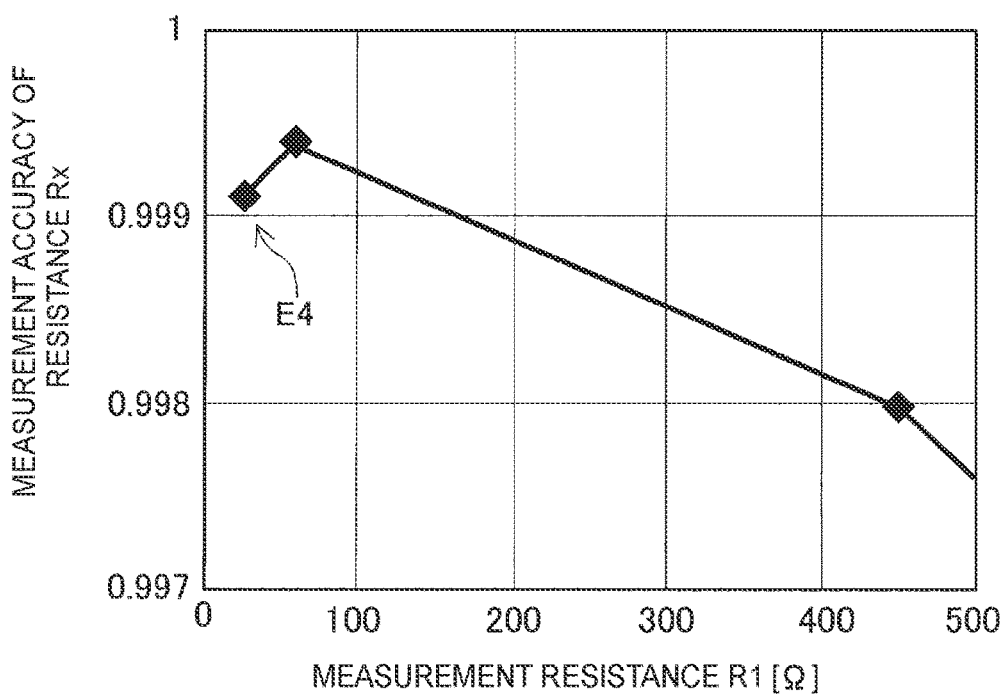
FIG. 12 is a graph showing a part of FIG. 11 as it is enlarged.

In FIG. 12, the measurement accuracy is at the highest level when the resistance value R1 is about 50 to 70Ω. The resistance value R1 at which the highest measurement accuracy is achieved may be said to be the optimum resistance value R1 of the resistor 17. The influence of large current in the extremely low resistance region as described above appears more significantly as the storage capacity of the secondary battery 1 is smaller, and appears less significantly as the storage capacity is larger. Thus, the optimum resistance value R1 differs depending on the storage capacity of the secondary battery 1. Namely, the optimum resistance value R1 is larger as the storage capacity is smaller, and is smaller as the storage capacity is larger.

Thus, the resistance value R1 of the resistor 17 as variable resistance is set, according to the storage capacity of the secondary battery 1 to be inspected. With the resistance value R1 thus set, the above steps (3) and (4) are carried out, so that the parasitic resistance Rx can be measured with higher accuracy. Such a high accuracy is not required with regard to the storage capacity of the secondary battery 1. A standard value for the accuracy according to the specifications of the secondary battery 1 suffices, and individual differences may not be taken into consideration. More specifically, the resistance value R1 to be set may be determined and stored in advance, for the specifications of each of the secondary batteries 1 that could be inspected. Then, the controller 22 sets the resistance value R1 of the resistor 17, according to the specifications of the secondary battery 1 to be inspected. The resistor 17 mounted in the inspection system 13 of FIG. 1 may not have a wide variable range including a high resistance region as indicated in FIG. 11, but a variable range that covers several ohms to several hundreds of ohms is sufficient.

Once the resistance value R1 is determined in the manner as described above, the resistance value R1 thus determined may be reflected by the imaginary resistance Rim at the time when the converged circuit current IB is measured. Namely, as the determined resistance value R1 is lower, the imaginary resistance Rim can be set to a value closer to the parasitic resistance Rx. This is because the accuracy in measurement of the parasitic resistance Rx is higher as the determined resistance value R1 is lower, for the reason as described above with reference to FIG. 11. Accordingly, as the resistance value R1 is lower, the above-indicated coefficient K for the imaginary resistance Rim can be set to be larger (closer to 1). Namely, as the storage capacity of the secondary battery 1 is larger, the inspection time can be shorter.

More specifically, for each of the secondary batteries 1 that could be inspected, the resistance value R1 to be set for the resistor 17 may be designated in advance, according to the storage capacity on the specifications of the secondary battery 1 to be inspected. Then, the resistance value R1 thus designated may be set on the resistor 17, according to the specifications of the secondary battery 1 to be inspected. Thus, the parasitic resistance Rx can be measured with the optimum resistance setting according to the specifications of the secondary battery 1, and the secondary battery 1 can be inspected in a considerably short time.

As described above in detail, according to this embodiment, the parasitic resistance Rx including contact resistance, in the circuit for inspection, is measured in advance, when it is determined whether the self-discharge amount of the secondary battery 1 is large or small, via current measurement. To this end, the ON time of the switch 18 is set according to the storage capacity of the secondary battery 1. Thus, the ON time is set to be relatively long when the secondary battery 1 having a large storage capacity is inspected, so as to improve the accuracy in measurement of the parasitic resistance Rx, whereas the ON time is set to be relatively short when the secondary battery 1 having a small storage capacity is inspected, so as to improve the accuracy in measurement of discharge current as a main target of the inspection. Thus, the method of inspecting the secondary battery 1 is implemented, assuring sufficient accuracy in the inspection as a whole irrespective of the magnitude of the storage capacity of the secondary battery 1 to be inspected.

Further, the resolution of the voltmeter 19 used for measurement of the parasitic resistance Rx is taken into consideration for setting of the ON time, so that the ON time can be set more appropriately. Also, the above-described inspecting method is carried out after the assembling step of the secondary battery 1, so as to implement a method of producing the secondary battery 1, which makes it possible to exclude inferior or defective products with high accuracy in a short time.

It is to be understood that this embodiment is merely exemplary, and the present disclosure is not limited to this embodiment. Thus, as a matter of course, the disclosure can be embodied with various improvements and modifications, without departing from the principle of the disclosure. For example, the arrangement of the resistor 17 and the switch 18 in the resistance path 16 may be selected as desired. Also, the type of the switch 18 may be selected from an analog switch, semiconductor switch, and any other switch.

The inspecting method of this embodiment may be performed not only on a secondary battery immediately after it is produced as a new product, but also on a secondary battery as a used product, for use in a remanufacturing process of used battery assemblies, for example. The inspecting method may also be performed not only on a single secondary battery, but also on a parallel joined assembly of two or more secondary batteries. In this case, however, the storage capacity is that of the parallel joined assembly as a whole. Also, the quality inspection is limited to the parallel joined assembly as a whole, in other words, the respective secondary batteries are not individually inspected. Also, the power storage device to be inspected is not limited to the secondary battery, but may be a capacitor, such as an electric double layer capacitor, or a lithium-ion capacitor.

What is claimed is:

1. A method of inspecting a power storage device, the method comprising:
   connecting a positive terminal of the power storage device with a positive terminal of an external power supply via a positive-side conductor, and connecting a negative terminal of the power storage device with a negative terminal of the external power supply via a negative-side conductor, to form a circuit, and placing a resistance path between the positive-side conductor and the negative-side conductor, the resistance path including a resistor and a switch connected in series;
   setting a length of an ON time for which the switch is temporarily closed before start of inspection of the power storage device, according to a storage capacity of the power storage device, such that the length of the ON time is related to the storage capacity of the power storage device;
   after the resistance path is placed, temporarily closing the switch over the ON time to be set, obtaining an ON voltage as a voltage between the positive-side conductor and the negative-side conductor within the ON time, and an OFF voltage as a voltage between the positive-side conductor and the negative-side conductor at a time other than the ON time, and calculating a parasitic resistance value of the circuit, based on a voltage value of the ON voltage, a voltage value of the OFF voltage, and a resistance value of the resistor; and
   after the parasitic resistance value of the circuit is calculated, applying a voltage of the external power supply to the power storage device in a condition where the switch is open, and inspecting the power storage device using a current value of the circuit, while increasing the voltage of the external power supply, according to the parasitic resistance value, within a range in which an absolute value of an imaginary resistance value is kept smaller than the parasitic resistance value of the circuit, the imaginary resistance value being a negative value obtained by converting an amount of increase of the current value of the circuit when the voltage of the external power supply is increased, into an amount of reduction of the parasitic resistance value of the circuit, the power storage device being inspected using the current value of the circuit, by determining whether a self-discharge current of the power storage device is larger or smaller than a predetermined value, based on a condition of convergence of the circuit current flowing in the circuit.

2. The method according to claim 1, further comprising a voltmeter that senses wherein
   when the ON time is set to be longer as the storage capacity of the power storage device is larger, and is set to be shorter as the storage capacity is smaller, the ON time is set to be shorter as a voltage resolution of the voltmeter used when calculating the parasitic resistance value of the circuit is higher, and is set to be longer as the voltage resolution is lower.

3. A method of producing a power storage device, the method comprising:
   assembling the power storage device; and
   carrying out the method of inspecting the power storage device according to claim 1, using the power storage device as an inspection object.

* * * * *